United States Patent
Liikanen et al.

(10) Patent No.: US 11,693,745 B2
(45) Date of Patent: Jul. 4, 2023

(54) ERROR-HANDLING FLOWS IN MEMORY DEVICES BASED ON BINS

(71) Applicant: MICRON TECHNOLOGY, INC., Boise, ID (US)

(72) Inventors: Bruce A. Liikanen, Berthoud, CO (US); Shane Nowell, Boise, ID (US); Steven Michael Kientz, Westminster, CO (US)

(73) Assignee: Micron Technology, Inc., Boise, ID (US)

(*) Notice: Subject to any disclaimer, the term of this patent is extended or adjusted under 35 U.S.C. 154(b) by 95 days.

(21) Appl. No.: 17/102,272

(22) Filed: Nov. 23, 2020

(65) Prior Publication Data

US 2022/0164263 A1    May 26, 2022

(51) Int. Cl.
| | |
|---|---|
| *G06F 11/20* | (2006.01) |
| *H03M 13/09* | (2006.01) |
| *G11C 16/34* | (2006.01) |
| *G06F 1/26* | (2006.01) |

(52) U.S. Cl.
CPC .......... *G06F 11/2002* (2013.01); *G06F 1/26* (2013.01); *G11C 16/3436* (2013.01); *H03M 13/09* (2013.01); *G06F 2201/85* (2013.01)

(58) Field of Classification Search
None
See application file for complete search history.

(56) References Cited

U.S. PATENT DOCUMENTS

| | | | | |
|---|---|---|---|---|
| 10,998,041 | B1* | 5/2021 | Avraham | G11C 16/26 |
| 11,244,732 | B2* | 2/2022 | Sharon | G06F 11/3058 |
| 2003/0193423 | A1* | 10/2003 | Ng | G11B 20/1403 |
| 2017/0117053 | A1* | 4/2017 | Sharon | G06F 11/1068 |
| 2020/0066361 | A1* | 2/2020 | Ioannou | G06F 3/0679 |
| 2020/0310926 | A1* | 10/2020 | Lee | G06F 11/1441 |
| 2021/0065813 | A1* | 3/2021 | Papandreou | G11C 16/0483 |
| 2021/0125656 | A1* | 4/2021 | Müller | G11C 11/223 |
| 2022/0050777 | A1* | 2/2022 | Sheperek | G06F 3/064 |
| 2022/0057935 | A1* | 2/2022 | Sheperek | G06F 3/0604 |
| 2022/0059179 | A1* | 2/2022 | Sheperek | G11C 16/349 |
| 2022/0059181 | A1* | 2/2022 | Sheperek | G11C 29/44 |
| 2022/0076760 | A1* | 3/2022 | Kaynak | G11C 29/021 |
| 2022/0084596 | A1* | 3/2022 | Sheperek | G06F 12/0882 |
| 2022/0084605 | A1* | 3/2022 | Muchherla | G11C 11/5642 |

\* cited by examiner

*Primary Examiner* — Danny Chan
(74) *Attorney, Agent, or Firm* — Lowenstein Sandler LLP

(57) ABSTRACT

An example memory sub-system includes a memory device and a processing device, operatively coupled to the memory device. The processing device is configured to detect a power-up state of the memory device following a power loss event; detect a read error with respect to data residing in a block of the memory device, wherein the block is associated with a current voltage offset bin; and perform temporal voltage shift (TVS)-oriented calibration for associating the block with a new voltage offset bin.

20 Claims, 6 Drawing Sheets

ERROR-HANDLING FLOWS IN MEMORY DEVICES BASED ON BINS

TECHNICAL FIELD

Embodiments of the disclosure are generally related to memory sub-systems, and more specifically, are related to error-handling flows in memory devices based on bins.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Figure 1:
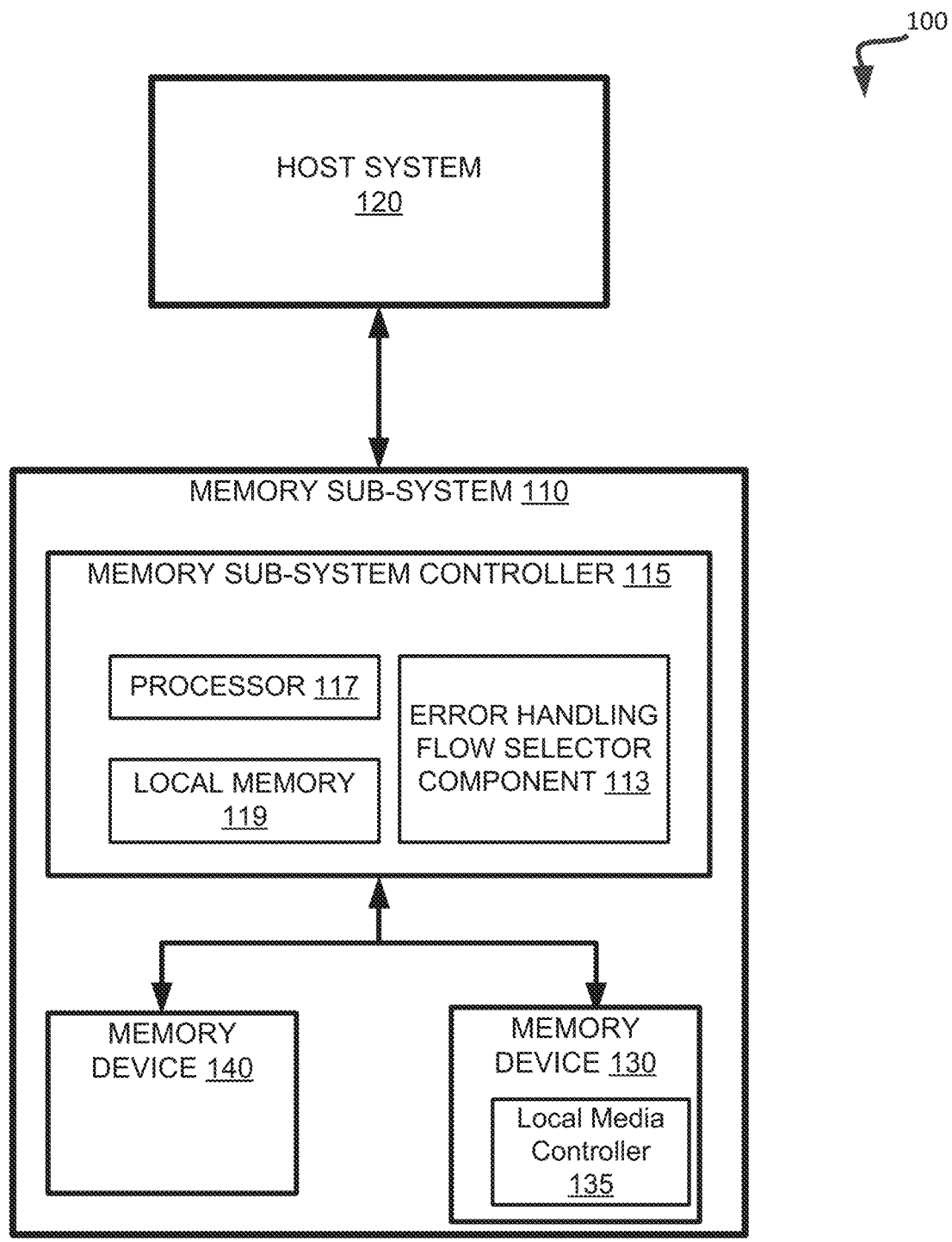
FIG. 1 illustrates an example computing system that includes a memory sub-system in accordance with some embodiments of the present disclosure.

Embodiments of the present disclosure are directed to block family-based error handling schemes for memory devices. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured threshold voltage exhibited by the memory cell to one or more reference voltage levels in order to distinguish between two logical levels for single-level cells and between multiple logical levels for multi-level cells. A voltage distribution is the distribution of threshold voltages within a set of NAND cells.

The threshold voltage of a memory cell changes in time as the electric charge of the cell is degrading, which is referred to as "temporal voltage shift (TVS)" (since the degrading electric charge causes the voltage distributions to shift along the voltage axis towards lower voltage levels). Temporal voltage shift (TVS) is the change in the measured voltage of cells as a function of time. Temporal Voltage Shift may include different components such as intrinsic charge loss, system charge loss, quick charge loss, etc. Replacement Gate (RG) NAND generally exhibits more TVS than floating gate NAND. TVS is generally increased by Program Erase Cycles (PEC), higher temperatures, and higher program voltages. TVS shows significant die-to-die variation.

The threshold voltage changes rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs block family based error avoidance strategies, thus significantly improving the bit error rate exhibited by the memory sub-system.

"Block" herein shall refer to a set of contiguous or non-contiguous memory pages. An example of "block" is "erasable block," which is the minimal erasable unit of memory, while "page" is a minimal writable unit of memory. Each page includes of a set of memory cells. A memory cell is an electronic circuit that stores information.

"Block family" herein shall refer to a possibly noncontiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics. A block family may be made with any granularity, containing only whole codewords, whole pages, whole super pages, or whole superblocks, or any combination of these.

A superblock is a set of data blocks that span multiple die that are written in an interleaved fashion. In some cases, a superblock may span all the die within an SSD. A superblock may contain multiple data blocks from a single die, such as one per plane. Drives may generally manage the erasure and programming of data on a superblock basis. A drive is a data storage device containing NAND. Examples of drives are SSDs, mobile storage drives, hybrid drives, etc. Generally speaking, a host is a computer that interfaces to the drive and a system is the host and the drive taken together.

"Data state metric" herein shall refer to a quantity that is measured or inferred from the state of data stored on a memory device. Specifically, the data state metrics may reflect the state of the temporal voltage shift, the degree of read disturb, and/or other measurable functions of the data state. A composite data state metric is a function (e.g., a weighted sum) of a set of component state metrics.

Block Family Creation is the process of opening a block family, maintaining that open block family for a duration, and then closing that block family. Opening a block family starts the Open Block Family Tenure, a time during which the drive may write data to the block family or my read data from the block family. Closing a block family starts the Closed Block Family Tenure, a time during which the drive may read data from the block family but not write data to the block family. Invalidating the block family starts the Invalid Block Family Tenure, a time during which the block family contains no data which has not been rendered invalid, normally through garbage collection. The open block family tenure and the closed block family tenure together are the Block Family Tenure.

Block Family Error Avoidance (BFEA) is an algorithm that tracks TVS to keep each block/Superblock or pages within a block/Superblock calibrated well enough to have an acceptable Bit Error Rate (BER) and Trigger Rate during the block family tenure. A Dynamic Tracking Block (DTB) is a set of cells that is written for the purpose of tracking the degree of TVS or for inferring an amount of time that has passed, such as when performing a re-synchronization ("re-sync").

In accordance with embodiments of the present disclosure, the temporal voltage shift (TVS) is selectively tracked for programmed blocks grouped by block families, and appropriate voltage offsets, which are based on block affiliation with a certain block family, are applied to the base read levels in order to perform read operations. A read level is a voltage position. Read levels are numbered in increasing voltage from L1 through 2^(number of bits). As an example, for TLC, the read levels would be L1, L2, . . . , L7.

A read level value is a voltage or DAC value representing a voltage that that is applied to the read element (often, the control gate for a NAND cell) for purposes of reading that cell.

A read level offset is a component of the equation that determines the read level value. Offsets may be summed (i.e., read level value=offset_a+offset_b+ . . . ). By convention, one of the read level offsets may be called the read level base.

"Base read level" herein shall refer to the initial threshold voltage level exhibited by the memory cell immediately after programming. In some implementations, base read levels can be stored in the metadata of the memory device.

Block families can be created asynchronously with respect to block programming events. In an illustrative example, a new block family can be created whenever a specified period of time (e.g., a predetermined number of minutes) has elapsed since creation of the last block family or the reference temperature of memory cells has changed by more than a specified threshold value. The memory sub-system controller can maintain an identifier of the active block family, which is associated with one or more blocks as they are being programmed.

The memory sub-system controller can periodically perform a calibration process in order to associate each die of every block family with one of the predefined threshold voltage offset bins, which is in turn associated with the voltage offset to be applied for read operations. Calibration is altering a read level value (possibly by adjusting a read level offset or read level base) to better match the ideal read levels for a read or set of reads. The associations of blocks with block families and block families and dies with threshold voltage offset bins can be stored in respective metadata tables maintained by the memory sub-system controller.

A bin is a set of read level offsets that are applied to a set of data. The bin offsets are read level offsets that affect the read level for block families within the bin. In this context, a bin is usually primarily directed at addressing TVS, but may also be directed at other mechanisms. An older bin is one where the read levels offsets are directed at data that was written at a relatively early time. A young or younger bin is one where the read levels are directed at data written relatively recently. An old or older bin is one where the read levels are directed at data written relatively recently. The read level adjustments may be implemented through either offsets or read retries, or even as an adjustment to the base. Bin selection is the process by which the drive bin selects which bin to use for a given read.

Upon receiving a read command, the memory sub-system controller can identify the block family associated with the block identified by the logical block address (LBA) specified by the read command, identify the threshold voltage offset bin associated with the block family and die on which the block resides, compute the new threshold voltage by additively applying the threshold voltage offset associated with the threshold voltage offset bin to the base read level, and perform the read operation using the new threshold voltage, as described in more detail herein below.

The memory sub-system can experience down states, including power down states for periods of time that are sufficient for the voltage bin associations of family blocks to become stale during the slow charge loss that was continuously happening during such a power down state. Furthermore, the memory sub-system may not register the power down even time and/or may lose the real-time clock during the power down state. Accordingly, when the memory sub-system is powered up after a power down state, it may not always compute the duration of the power down state in order to adjust the voltage bin assignments. Therefore, the memory sub-system should perform calibration operations (also referred to as scan operations) in order to adjust the voltage bin assignments for the block families that are defined in the memory sub-system.

Upon the power up event, it is desirable to complete the adjustments of voltage bin assignments within the shortest time possible. Aspects and embodiments of the present disclosure address this problem by disclosing efficient bin re-synchronization ("resync") following a power up event for minimizing errors in subsequent read operations. Upon detecting a power up event, the memory sub-system controller can initiate re-synchronization of the stored voltage bin associations. In accordance with aspects of the present disclosure, the re-synchronization involves applying temporal voltage shift (TVS)-oriented calibration procedures, since the TVS is presumed to be the dominant voltage distortion mechanism during power down states.

Accordingly, the memory sub-system controller can perform scan of the memory device and re-synchronization of pointers of the block families based on the acquired data state metric values (e.g., bit error rate). The scan can involve performing, with respect to selected blocks within a block family that is being scanned, read operations utilizing different threshold voltage offsets to select the threshold voltage offset that optimizes a chosen data state metric (e.g., minimizes the bit error rate of the read operations). The TVS-specific calibration procedures may involve utilizing the voltage offsets that correspond to voltage offset bins defined in the memory sub-system, e.g., a voltage offset bin that is immediately adjacent to the voltage offset bin that has been assigned to the block family before the power down event. In some implementations, the voltage offsets utilized for the calibration operations can have higher granularity than the voltage offsets associated with the voltage offset bins defined in the memory sub-system.

Furthermore, in some implementations, the calibration operations may be performed with the emphasis for the lowest voltage offset bins, since they are more likely to have moved to new bins during a power off state, as described in more detail herein below.

Therefore, advantages of the systems and methods implemented in accordance with some embodiments of the present disclosure include, but are not limited to, improving the bit error rate in read operations by maintaining metadata tracking groups of blocks (block families) that are presumed to exhibit similar voltage distributions and selectively performing calibration operations for limited subsets of blocks based on their block family association, as described in more detail herein below.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130).

In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes an error-handling flow selector component 113 that can be used to implement the block family-based error avoidance strategies in accordance with embodiments of the present disclosure. In some embodiments, the controller 115 includes at least a portion of the error-handling flow selector component 113. For example, the controller 115 can include a processor 117 (processing device) configured to execute instructions stored in local memory 119 for performing the operations described herein. In some embodiments, the error-handling flow selector component 113 is part of the host system 120, an application, or an operating system. The error-handling flow selector component 113 can manage block families associated with the memory devices 130, as described in more detail herein below.

Figure 2:
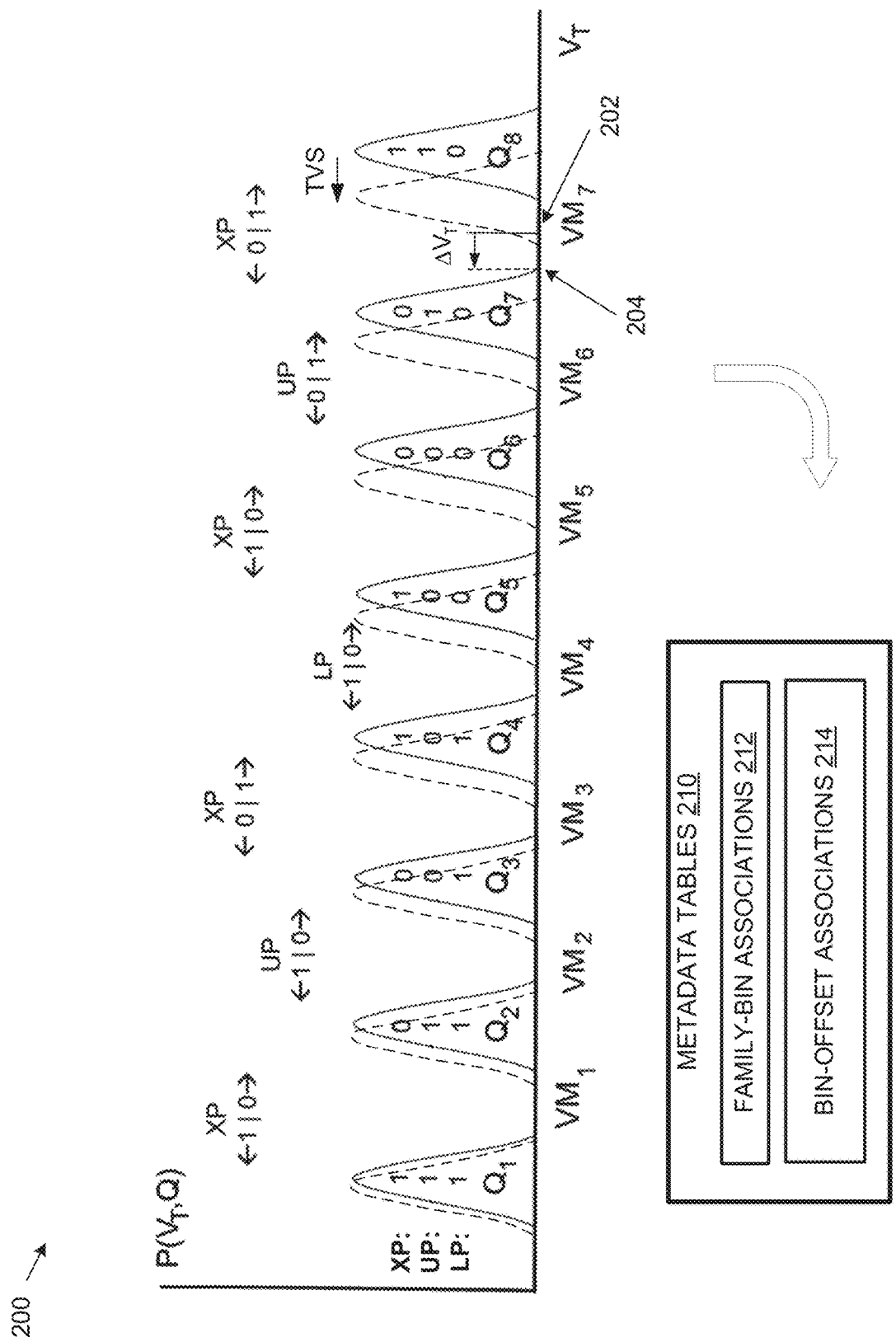
FIG. 2 illustrates schematically temporal voltage shift of a three-level memory cell capable of storing three bits of data by programming the memory cell into eight charge states that differ by the amount of charge on the cell's floating gate, in accordance with some embodiments of the present disclosure.

FIG. 2 illustrates schematically temporal voltage shift (TVS) of a three-level memory cell (TLC) capable of storing three bits of data by programming the memory cell into eight charge states $Q_k$ that differ by the amount of charge on the cell's floating gate, in accordance with some embodiments of the present disclosure. The distributions of threshold voltages $P(V_T, Q_k)$ are separated with 7 valley margins $VM_n$. The cell programmed into k-th charge state ($Q_k$) can store a particular combination of 3 bits. For example, the charge state $Q_k$ can store the binary combination 101, as depicted. This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not. A memory cell can be configured to store N=1 bits (SLC), N=2 bits (MLC), N=3 bits (TLC), N=4 bits (QLC), and so on, depending on how many distributions can be fit (and interspersed with adequate-size valley margins) within the working range of the control gate voltages. Even though FIG. 2 depicts a TLC, the operations described in the present disclosure can be applied to any N-bit memory cells.

Memory cells are typically joined by wordlines (conducting lines electrically connected to the cells' control gates) and programmed together as memory pages (e.g., 16 KB or 32 KB pages) in one setting (by selecting consecutive bitlines connected to the cells' source and drain electrodes). After three programming passes, a wordline of triple-level cells can store up to three pages: lower page (LP), upper page (UP), and extra page (XP). For example, upon the first programming pass, the cell can be driven to one of the charge states $Q_1$, $Q_2$, $Q_3$, $Q_4$ (corresponding to LP bit value 1, as shown in FIG. 2) or one of the charge states $Q_5$, $Q_6$, $Q_7$, $Q_8$ (corresponding to LP bit value 0). Upon the second path, when the UP is programmed into the same wordline, the charge state of the memory cell can be adjusted so that the range of possible locations of the cell's threshold voltage is further narrowed. For example, a cell that is in one of the charge states $Q_1$, $Q_2$, $Q_3$, or $Q_4$ (LP bit value 1) can be driven to just one of the two states $Q_1$ or $Q_2$, (corresponding to UP bit value 1) or to one of the two states $Q_3$ or $Q_4$ (corresponding to UP bit value 0). Similarly, upon the third programming path, the charge state of the memory cell can be fine-tuned even more. For example, a cell that is in the logic state 10 (i.e., UP bit stores value 1 and LP bit stores value 0) and is in one of the charge states $Q_7$ or $Q_8$ can be driven to state $Q_7$ (corresponding to XP bit value 0) or to state $Q_8$ (corresponding to XP bit value 1). Conversely, during a read operation, the memory controller 115 can determine that the applied control gate voltage $V_{CG}$ within the sixth valley margin $VM_6$ is not insufficient to open the cell to the source-drain electric current whereas the control gate voltage within the seventh valley margin $VM_7$ is sufficient to open the open the cell. Hence, the memory controller 115 can determine that the cell is in the charge state $Q_7$ corresponding to the logic state 010 (i.e. XP: 0, UP: 1, LP: 0).

The distributions of threshold voltages depicted with solid lines in FIG. 2 are distributions that the memory cells have immediately after programming. With the passage of time, as a result of a slow charge loss, the distributions shift (typically, towards lower values of $V_T$), as shown by the shifted valleys indicated with dashed lines. As a result, the threshold voltages of various memory cells are shifted by certain values $\Delta V_T$ that can depend on the time elapsed since programming, environmental conditions (e.g., ambient temperature), and so on. For optimal read operations, the controller 115 (or SSC 113) can, therefore, adjust the base read levels with the corresponding offsets $V_R \rightarrow V_R + \Delta V$, which are the same (or approximately the same) as the temporal voltage shifts. In one embodiment, the offsets can be determined (or estimated) as the difference between the center of the valley margin (such as the center 202 of $VM_7$) immediately after programming and the center of the same—but shifted—valley margin (such as the new center 204) at some later instance of time. As depicted schematically in FIG. 2, TVS of different distributions (valleys) and valley margins can differ from each other. In a typical scenario depicted in FIG. 2, TVS is greater for larger charges Q and smaller for lesser charges.

As shown in FIG. 2, the TVS in a memory device is a continuous process. In some embodiments, however, an adequate accuracy of voltage offsets can be achieved using a discrete set of bins and, accordingly, a discrete set of voltage offsets $\Delta V$. In such embodiments, TVS phenomenon can be addressed with setting up a number of discrete bins, e.g., five, eight, twenty, etc., associated with various memory partitions. The bin-related data can be stored in the metadata tables 210. The associations of various memory partitions (grouped into families, as described in more detail below) with bins can be stored in family-bin associations 212; the family-bin associations can dynamically change with the passage of time. For example, as the memory cells continue to lose charge with time, the respective memory partitions (grouped into families) can be moved, in a consecutive fashion, from junior bins to more senior bins having larger voltage offsets. Bin-offset associations 214 can also be stored in the metadata tables 210. In some embodiments, the bin-offset associations 214 can be static whereas the family-bin associations 212 can be adjusted (based on calibration of the memory partitions) to account for the actual charge loss by the memory cells of the respective partitions. In some embodiments, family-bin associations 212 can store logical addresses of the memory partitions, such as LBA of the respective blocks, while associations of LBAs with respective physical block addresses (PBA) can be stored outside the metadata tables 210, e.g., in memory translations tables stored separately in the local memory 119 or one of the memory devices 130, 140. In some embodiments, however, family-bin associations 212 can additionally include LBA-to-PBA translations or store direct PBA-to-bin associations. As schematically depicted with a curved arrow in FIG. 2, the number of bins, the bin-offset associations 214, the partitionbin associations can be based upon calibration of the memory device (or similar types of memory devices, e.g., during design and manufacturing) for maximizing performance and minimizing read errors during read operations.

The threshold voltage offset depends on the time after program (TAP). TAP is the time since a cell has been written and is the primary driver of TVS. TAP may be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement may be made (e.g., perform reference calibration from 8 to 12 minutes after program). A time slice may be referenced by its center point (e.g., 10 minutes).

Blocks of the memory device are grouped into block families, such that each block family includes one or more blocks that have been programmed within a specified time window and possibly a specified temperature window. As noted herein above, since the time elapsed after programming and temperature are the main factors affecting the temporal voltage shift, all blocks and/or partitions within a single block family are presumed to exhibit similar distributions of threshold voltages in memory cells, and thus would require the same voltage offsets for read operations.

Block families can be created asynchronously with respect to block programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family.

A newly created block family can be associated with bin 0. Then, the memory sub-system controller can periodically perform a calibration process in order to associate each die of every block family with one of the predefines threshold voltage offset bins (bins 0-9 in the illustrative example of FIG. 3), which is in turn associated with the voltage offset to be applied for read operations. The associations of blocks with block families and block families and dies with threshold voltage offset bins can be stored in respective metadata tables maintained by the memory sub-system controller.

The voltage distributions change in time due to the slow charge loss (SCL), which results in drifting values of the threshold voltage levels. In various embodiments of the present disclosure, the temporal voltage shift is selectively tracked for programmed blocks grouped by block families, and appropriate voltage offsets, which are based on block affiliation with a certain block family, are applied to the base read levels in order to perform read operations.

Figure 3:
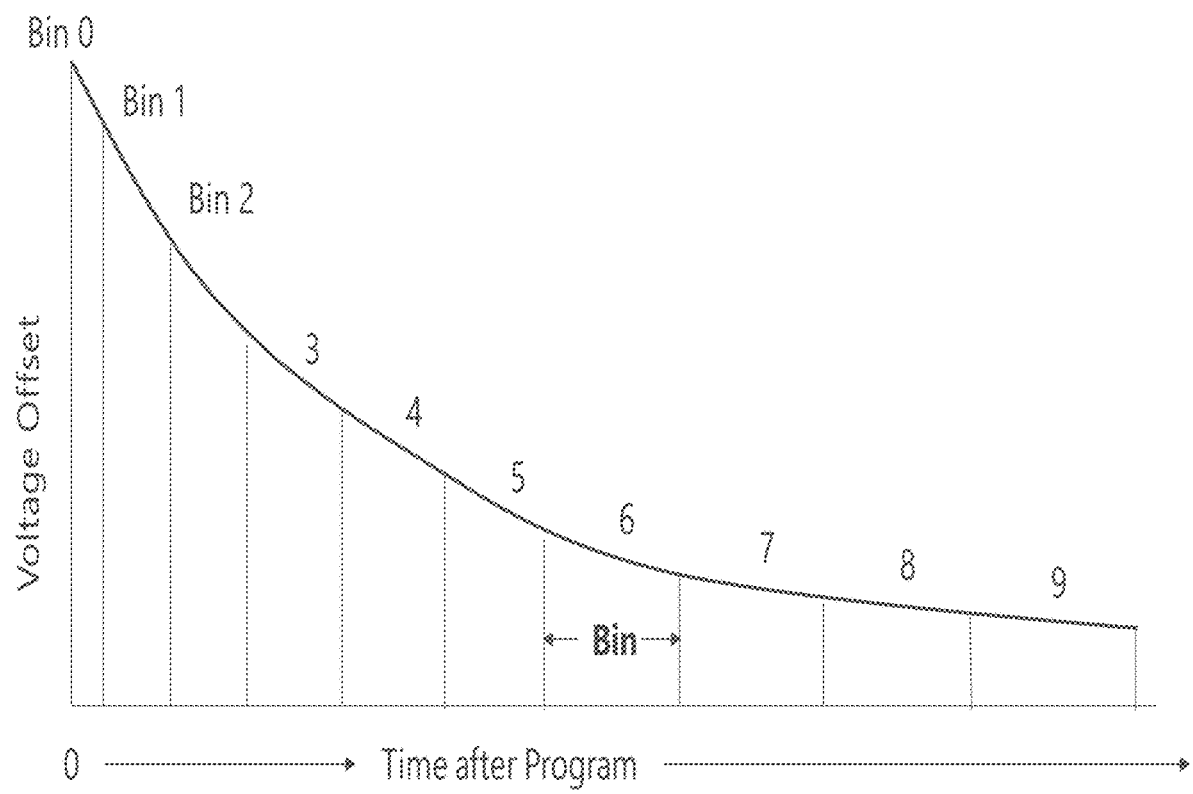
FIG. 3 depicts an example graph illustrating the dependency of the threshold voltage offset on the time after program (i.e., the period of time elapsed since the block had been programmed, in accordance with some embodiments of the present disclosure.

FIG. 3 schematically illustrates a set of predefined threshold voltage offset bins (bin 0 to bin 9), in accordance with embodiments of the present disclosure. As schematically illustrated by FIG. 3, the threshold voltage offset graph 300 can be subdivided into multiple threshold voltage offset bins, such that each bin corresponds to a predetermined range of threshold voltage offsets. While the illustrative example of FIG. 3 defines ten bins (0-9), in other implementations, various other numbers of bins can be employed (e.g., 64 bins). Based on a periodically performed calibration process, the memory sub-system controller associates each die of every block family with a threshold voltage offset bin, which defines a set of threshold voltage offsets to be applied to the base voltage read level in order to perform read operations, as described in more detail herein below.

Figure 4:
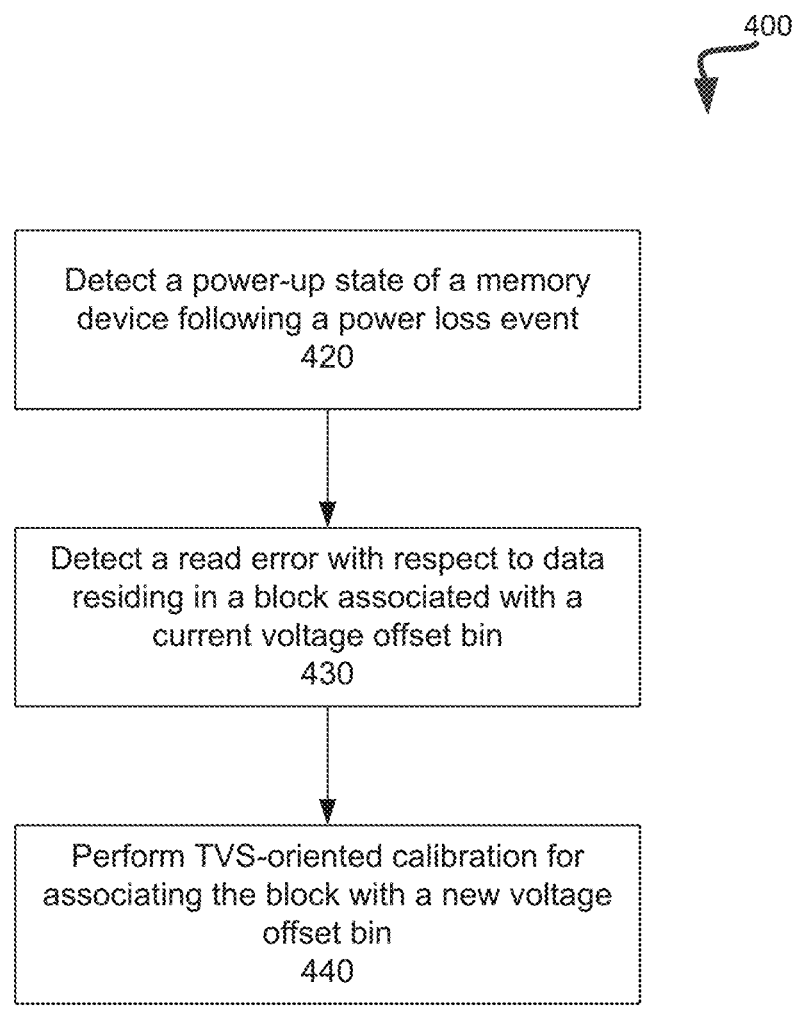
FIG. 4 is a flow diagram of an example method of performing a calibration process to minimize/avoid error specific to the phenomenon of temporal voltage shift (TVS), in accordance with embodiments of the present disclosure.

FIG. 4 is a flow diagram of an example method 400 of error-handling flow selection management implemented by a memory sub-system controller operating in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the error-handling flow selector component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 420, the error-handling flow selector component detects a power-up state of the memory device following a power loss event. Memory blocks may be associated with respective voltage offset bins based on statistical analysis of test data obtained from test devices mimicking the memory device. The test data can include read error data when read operations are performed in similar environmental and operational conditions as the real memory device is likely to experience. As described above, during a power loss event, all previously stored associations of memory blocks with specific voltage offset bins may be lost, and the memory device may need to be recalibrated (e.g., by initiating a re-synchronization operation) to correct and/or avoid read errors. The read errors may be associated with host-initiated read operations or system-initiated scanning operations.

At operation 430, the error-handling flow selector component detects a read error with respect to data residing in a block of the memory device. As described above, the block is initially associated with a current voltage offset bin based on statistical analysis of test data. In certain embodiments, if two or more read errors are detected with respect to multiple blocks, the error-handling flow selector component selects a block associated with a voltage offset bin corresponding to a lowest voltage offset value. In other words, priority is given to relatively older bins over relatively younger bins, as the likelihood of TVS being the dominant voltage distortion mechanism in the older bins is much higher than that in the relatively younger bins. Note that detecting the read error is performed wither in response to performing a host-initiated read operation or performing a calibration operation.

At operation 440, responsive to error detection, the error-handling flow selector component performs temporal voltage shift (TVS)-oriented calibration for associating the block with a new voltage offset bin. This is further elaborated with respect to FIG. 5.

Figure 5:
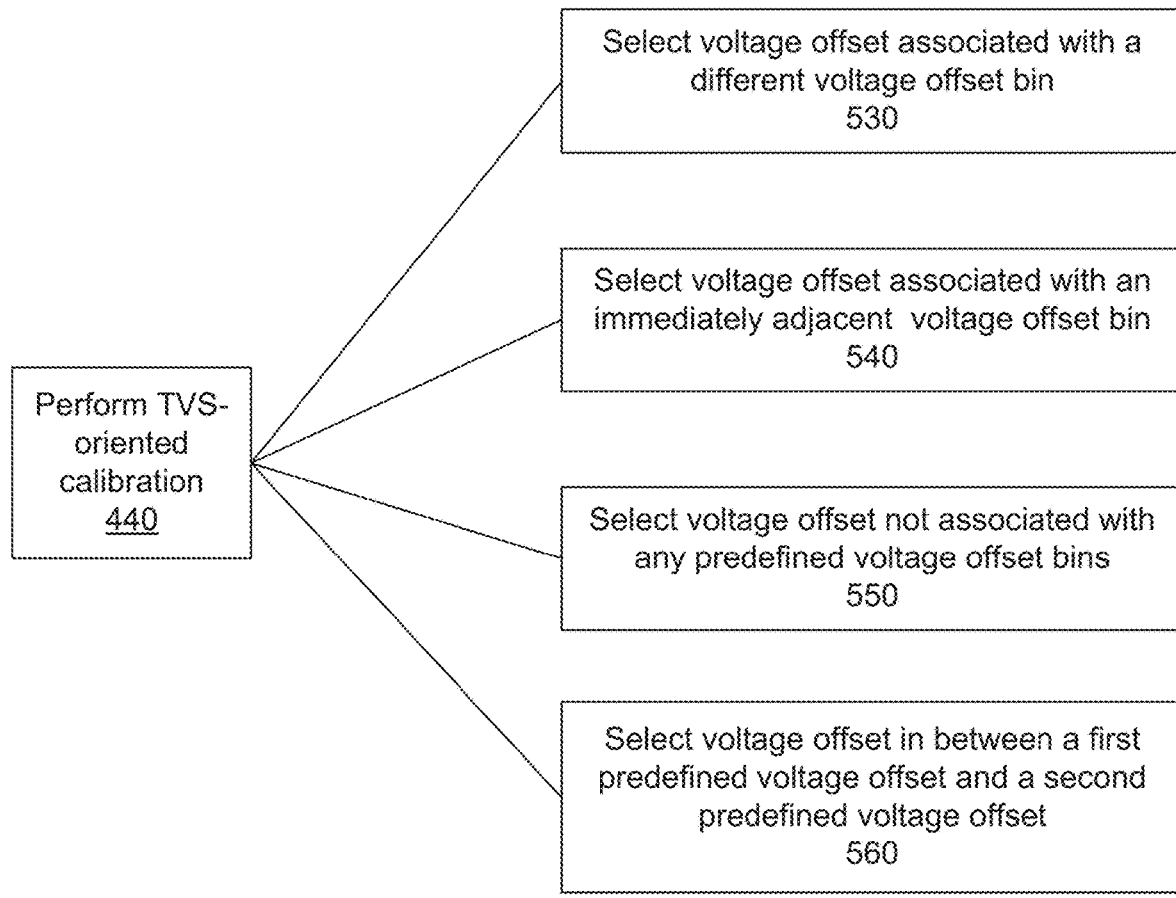
FIG. 5 shows various possible voltage offset schemes that can be applied during performing TVS-oriented calibration, in accordance with embodiments of the present disclosure.

FIG. 5 shows various possible voltage offset schemes that can be applied during performing TVS-oriented calibration, as described at operation 440 of the method described in FIG. 4, in accordance with some embodiments of the present disclosure. Four such possible voltage offset schemes are shown in FIG. 5, though persons skilled in the art would appreciate other schemes are also within the scope of this disclosure. In an embodiment, the selected voltage offset can be equal to the offset required to associate the memory block with a different predefined voltage offset bin (operation 530). For example, the voltage offset applied can be equal to the voltage offset between 'n' number of consecutive bins. In an alternative embodiment, the selected voltage offset can be such that with the application of the voltage offset, the memory block is associated with the immediately adjacent voltage offset bin (operation 540). In certain other embodiments, a value of voltage offset can be selected which is not associated with any voltage offset bin of multiple predefined voltage offset bins associated with the memory device (operation 550). In other words, the granularity of applied voltage offset does not have to be tied to the predefined voltage offsets associated with the memory device. For example, operation 560 depicts that a voltage offset value can be selected which is between a first voltage offset and a second voltage offset, where the first voltage offset is associated with a first voltage offset bin of multiple voltage offset bins associated with the memory device, and the second voltage offset is associated with a second voltage offset bin of the multiple voltage offset bins.

Figure 6:
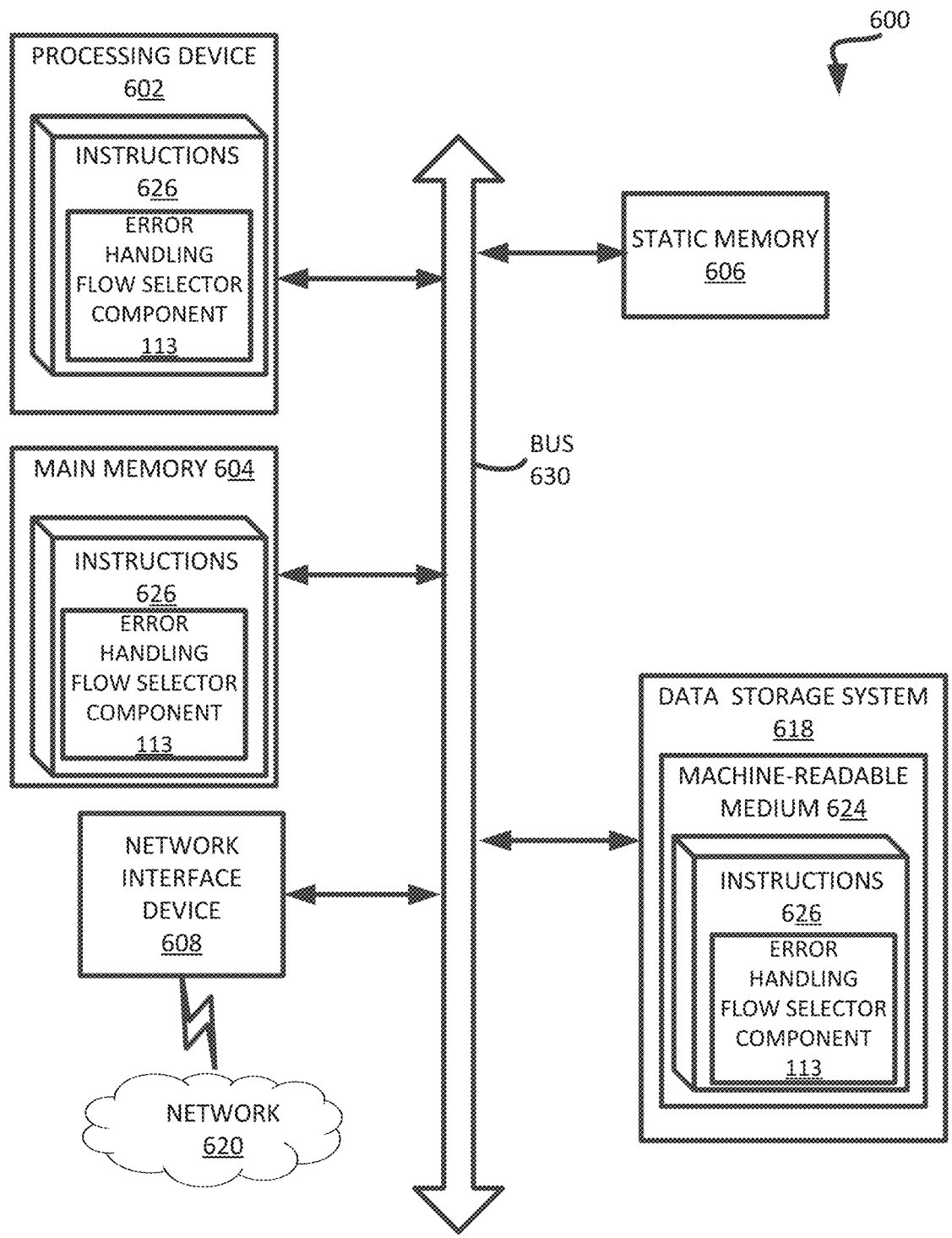
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the error-handling flow selector component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 608 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 628 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 628 or software embodying any one or more of the methodologies or functions described herein. The instructions 628 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 628 include instructions to implement functionality corresponding to the error-handling flow selector component 113 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
  a memory device comprising a plurality of blocks; and
  a processing device, operatively coupled to the memory device, performing the operations comprising:
    detecting a power-up state of the memory device following a power loss event;
    detecting a read error with respect to data residing in two or more blocks of the plurality of blocks of the memory device, wherein each of the plurality of blocks is associated with a respective current voltage offset bin of a plurality of voltage offset bins, wherein each voltage offset bin of the plurality of voltage offset bins is associated with a respective predefined voltage offset value; and
    re-synchronizing the two or more blocks by performing temporal voltage shift (TVS)-oriented calibration for associating each of the two or more blocks with a respective new voltage offset bin of the plurality of voltage offset bins, wherein the two or more blocks are re-synchronized in reverse order of recency of the voltage offset bins to compensate for difference in respective accumulated voltage offsets over time.

2. The system of claim 1, wherein the operations further comprise:
  responsive to detecting two or more read errors with respect to multiple blocks of the plurality of blocks, selecting, among the multiple blocks, a block associated with a voltage offset bin corresponding to a lowest voltage offset value among the plurality of voltage offset bins.

3. The system of claim 1, wherein performing temporal voltage shift (TVS)-oriented calibration further comprises:
  selecting a voltage offset associated with a second voltage offset bin of the plurality of voltage offset bins.

4. The system of claim 1, wherein performing temporal voltage shift (TVS)-oriented calibration further comprises:
  selecting a voltage offset associated with a second voltage offset bin which is immediately adjacent to the current voltage offset bin.

5. The system of claim 1, wherein performing temporal voltage shift (TVS)-oriented calibration further comprises:
  selecting a voltage offset which is not associated with any voltage offset bin of the plurality of voltage offset bins associated with the memory device.

6. The system of claim 1, wherein performing temporal voltage shift (TVS)-oriented calibration further comprises:
  selecting a voltage offset which is between a first voltage offset and a second voltage offset, wherein the first voltage offset is associated with a first voltage offset bin of the plurality of voltage offset bins associated with the memory device, and wherein the second voltage offset is associated with a second voltage offset bin of the plurality of voltage offset bins.

7. The system of claim 1, wherein detecting the read error is performed responsive to one of: performing a host-initiated read operation or performing a calibration operation.

8. A method comprising:
  determining a respective current voltage offset bin associated with each block of a plurality of blocks of a memory device, wherein the respective current voltage offset bin is one of a plurality of voltage offset bins, wherein each voltage offset bin of the plurality of voltage offset bins is associated with a respective predefined voltage offset value;
  detecting a power-up state of the memory device following a power loss event; and
  initiating a re-synchronization process to avoid read error with respect to data residing in two or more blocks of the plurality of blocks of the memory device, wherein the re-synchronization process performs temporal voltage shift (TVS)-oriented calibration for associating each of the two or more blocks with a respective new voltage offset bin of the plurality of voltage offset bins, wherein the two or more blocks are re-synchronized in reverse order of recency of the voltage offset bins to compensate for difference in respective accumulated voltage offsets over time.

9. The method of claim 8, further comprising:
  responsive to detecting two or more read errors with respect to multiple blocks of the plurality of blocks in the power-up state, selecting, among the multiple blocks, a block associated with a voltage offset bin corresponding to a lowest voltage offset value among the plurality of voltage offset bins.

10. The method of claim 8, wherein performing temporal voltage shift (TVS)-oriented calibration further comprises:
  selecting a voltage offset associated with a second voltage offset bin of the plurality of voltage offset bins.

11. The method of claim 8, wherein performing temporal voltage shift (TVS)-oriented calibration further comprises:

selecting a voltage offset associated with a second voltage offset bin which is immediately adjacent to the current voltage offset bin.

12. The method of claim 8, wherein performing temporal voltage shift (TVS)-oriented calibration further comprises:
selecting a voltage offset which is not associated with any voltage offset bin of the plurality of voltage offset bins associated with the memory device.

13. The method of claim 8, wherein performing temporal voltage shift (TVS)-oriented calibration further comprises:
selecting a voltage offset which is between a first voltage offset and a second voltage offset, wherein the first voltage offset is associated with a first voltage offset bin of the plurality of voltage offset bins associated with the memory device, and wherein the second voltage offset is associated with a second voltage offset bin of the plurality of voltage offset bins.

14. The system of claim 1, further comprising:
detecting a read error with respect to data residing in a block of the memory device, responsive to one of: performing a host-initiated read operation or performing a calibration operation.

15. A non-transitory computer readable medium comprising instructions, which when executed by a processing device, cause the processing device to perform operations comprising:
detecting a power-up state of the memory device following a power loss event, wherein the memory device comprises a plurality of blocks;
detecting a read error with respect to data residing in two or more blocks of the plurality of blocks of the memory device, wherein each block of the plurality of blocks is associated with a respective current voltage offset bin of a plurality of voltage offset bins, wherein each voltage offset bin of the plurality of voltage offset bins is associated with a respective predefined voltage offset value; and
re-synchronizing the two or more blocks by performing temporal voltage shift (TVS)-oriented calibration for associating each of the two or more blocks with a respective new voltage offset bin of the plurality of voltage offset bins, wherein the two or more blocks are re-synchronized in reverse order of recency of the voltage offset bins to compensate for difference in respective accumulated voltage offsets over time.

16. The non-transitory computer readable medium of claim 15, wherein the operations further comprises:
responsive to detecting two or more read errors with respect to multiple blocks of the plurality of blocks, selecting, among the multiple blocks, a block associated with a voltage offset bin corresponding to a lowest voltage offset value among the plurality of voltage offset bins.

17. The non-transitory computer readable medium of claim 15, wherein performing temporal voltage shift (TVS)-oriented calibration further comprises:
selecting a voltage offset associated with a second voltage offset bin of the plurality of voltage offset bins.

18. The non-transitory computer readable medium of claim 15, wherein performing temporal voltage shift (TVS)-oriented calibration further comprises:
selecting a voltage offset associated with a second voltage offset bin which is immediately adjacent to the current voltage offset bin.

19. The non-transitory computer readable medium of claim 15, wherein performing temporal voltage shift (TVS)-oriented calibration further comprises:
selecting a voltage offset which is not associated with any voltage offset bin of the plurality of voltage offset bins associated with the memory device.

20. The non-transitory computer readable medium of claim 15, wherein performing temporal voltage shift (TVS)-oriented calibration further comprises:
selecting a voltage offset which is between a first voltage offset and a second voltage offset, wherein the first voltage offset is associated with a first voltage offset bin of the plurality of voltage offset bins associated with the memory device, and wherein the second voltage offset is associated with a second voltage offset bin of the plurality of voltage offset bins.

* * * * *